United States Patent
Lee et al.

(10) Patent No.: US 8,939,784 B2
(45) Date of Patent: Jan. 27, 2015

(54) TEST SOCKET HAVING A HOUSING WITH CLAMPING DEVICES TO CONNECT THE HOUSING TO A FLOATING GUIDE

(71) Applicant: Samsung Electronics Co., Ltd., Suwon-Si, Gyeonggi-Do (KR)

(72) Inventors: Sangki Lee, Asan-si (KR); Insik Kim, Asan-si (KR); Teaseog Um, Asan-si (KR); Suklae Kim, Cheonan-si (KR); Yoonoh Han, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 128 days.

(21) Appl. No.: 13/829,081

(22) Filed: Mar. 14, 2013

(65) Prior Publication Data

US 2013/0260592 A1  Oct. 3, 2013

(30) Foreign Application Priority Data

Mar. 30, 2012  (KR) ........................ 10-2012-0033564

(51) Int. Cl.
  *H01R 13/62*  (2006.01)
  *H01R 12/50*  (2011.01)
  *G01R 1/04*  (2006.01)

(52) U.S. Cl.
  CPC .............. *H01R 23/70* (2013.01); *G01R 1/0466* (2013.01); *G01R 1/0483* (2013.01)
  USPC .......................................... 439/331; 439/314

(58) Field of Classification Search
  USPC .................... 439/331, 342, 330, 266
  See application file for complete search history.

(56) References Cited

U.S. PATENT DOCUMENTS

| | | | |
|---|---|---|---|
| 5,109,320 A * | 4/1992 | Bourdelaise et al. | 361/785 |
| 6,776,643 B2 | 8/2004 | Nakano | |
| 6,976,863 B2 * | 12/2005 | Sato | 439/266 |
| 7,338,295 B2 * | 3/2008 | Wooden et al. | 439/73 |
| 7,578,678 B2 * | 8/2009 | Xie et al. | 439/71 |
| 8,143,909 B2 * | 3/2012 | Ryu | 324/750.16 |
| 8,425,246 B1 * | 4/2013 | Heng | 439/342 |
| 2003/0008544 A1 | 1/2003 | Nakano | |
| 2005/0136721 A1 | 6/2005 | Sato | |
| 2005/0153604 A1 * | 7/2005 | Mendenhall et al. | 439/838 |
| 2008/0020623 A1 | 1/2008 | Wooden | |
| 2010/0068914 A1 | 3/2010 | Jin et al. | |
| 2010/0295572 A1 | 11/2010 | Ryu | |
| 2011/0201221 A1 * | 8/2011 | Kobayashi | 439/331 |

FOREIGN PATENT DOCUMENTS

| | | |
|---|---|---|
| JP | 2004055357 A | 2/2004 |
| KR | 200356022 | 7/2004 |
| KR | 100910889 B1 | 8/2009 |
| KR | 20100099065 A | 9/2010 |
| KR | 20100127945 A | 12/2010 |
| KR | 101028754 B1 | 4/2011 |

* cited by examiner

*Primary Examiner* — Chandrika Prasad
(74) *Attorney, Agent, or Firm* — Harness, Dickey & Pierce, P.L.C.

(57) ABSTRACT

A semiconductor chip package test socket may include a socket housing; a plurality of probe needles in the socket housing; a conductive pad on the probe needles; a floating guide configured to cover an edge of the conductive pad and configured to provide a semiconductor chip package on the conductive pad; and/or clamps fixed at the socket housing. The clamps may combine the floating guide with the socket housing.

20 Claims, 3 Drawing Sheets

TEST SOCKET HAVING A HOUSING WITH CLAMPING DEVICES TO CONNECT THE HOUSING TO A FLOATING GUIDE

CROSS-REFERENCE TO RELATED APPLICATION(S)

This application claims priority from Korean Patent Application No. 10-2012-0033564, filed on Mar. 30, 2012, in the Korean Intellectual Property Office (KIPO), the entire contents of which are incorporated herein by reference.

BACKGROUND

1. Technical Field

Example embodiments of the inventive concept may relate to semiconductor reliability test devices. Example embodiments of the inventive concept also may relate to semiconductor chip package test sockets configured to perform electrical tests of semiconductor chip packages.

2. Description of the Related Art

Semiconductor devices may be manufactured by a fabrication process and an assembly process. An electrical die sorting (EDS) test is performed on the semiconductor devices by a probe apparatus in the assembly process. In this step, semiconductor devices classified into good products may be formed into semiconductor chip packages through a packaging process.

Before the semiconductor chip packages are provided to users, they are tested by an electrical test process. The electrical test process may be performed by a test socket and a test apparatus. The test socket may electrically connect external terminals (e.g., solder balls) of the semiconductor chip package to a printed circuit board (i.e., a load board) of the test apparatus. The test socket may include a housing receiving the semiconductor chip package, a conductive pad in contact with the external terminals of the semiconductor chip package, and probe pins under the conductive pad. Since the conductive pad may be damaged by the external terminals, it may have a lifetime of a predetermined accumulated usage time. However, it may be inconvenient to replace the conductive pad with new one in a general test socket of the semiconductor chip package. Thus, productivity may decrease.

SUMMARY

Example embodiments of the inventive concept may provide semiconductor chip package test sockets facilitating replacement of conductive pads.

Example embodiments of the inventive concept also may provide semiconductor chip package test sockets capable of increasing and/or maximizing productivity.

In some example embodiments, a semiconductor chip package test socket may comprise a socket housing; a plurality of probe needles in the socket housing; a conductive pad on the probe needles; a floating guide configured to cover an edge of the conductive pad and configured to provide a semiconductor chip package on the conductive pad; and/or clamps fixed at the socket housing. The clamps may combine the floating guide with the socket housing.

In some example embodiments, the clamps may include ball plungers.

In some example embodiments, the socket housing may have screw-holes configured to fix the ball plungers.

In some example embodiments, the socket housing may include a bottom part configured to support the probe needles and a sidewall part configured to surround the conductive pad and the floating guide. The screw-holes may penetrate the sidewall part and face each other.

In some example embodiments, an inner sidewall of the sidewall part of the socket housing may include a step configured to support the edge of the conductive pad and the floating guide. The screw-holes may be at a level lower than the step.

In some example embodiments, the floating guide may have a quadrangular ring-shape.

In some example embodiments, the floating guide may include concave regions in which the ball plungers are inserted.

In some example embodiments, the floating guide may include pin-holes.

In some example embodiments, the socket housing may include sidewall trenches aligned with the pin-holes.

In some example embodiments, the floating guide may include protrusions configured to fix the conductive pad.

In some example embodiments, the conductive pad may include alignments holes configured to receive the protrusions.

In some example embodiments, an inner sidewall of the floating guide may include an inclined plane.

In some example embodiments, each of the ball plungers may comprise a casing; a ball configured to move in the casing; a spring configured to provide an elastic force to the ball; and/or a support part configured to support the spring at a side opposite to the ball.

In some example embodiments, the semiconductor chip package test socket may further comprise a probe card fixing the probe needles and/or power lead-in wires connected to the probe card.

In some example embodiments, the socket housing may have a wire-hole under the probe card. The power lead-in wires may pass through the wire-hole.

In some example embodiments, a semiconductor chip package test socket may comprise a socket housing; a plurality of probe needles associated with the socket housing; a conductive pad configured to contact the probe needles; a floating guide configured to cover an edge of the conductive pad and configured to align a semiconductor chip package with the conductive pad; and/or a plurality of devices associated with the socket housing that are configured to connect the floating guide to the socket housing.

In some example embodiments, the semiconductor chip package test socket may further comprise a probe card fixing the probe needles and/or power lead-in wires connected to the probe card.

In some example embodiments, a semiconductor chip package test socket may comprise a socket housing; a plurality of probe needles associated with the socket housing; a conductive pad on the probe needles; a floating guide configured to cover an edge of the conductive pad and configured to align a semiconductor chip package on the conductive pad; and/or a plurality of devices associated with the socket housing that are configured to couple the floating guide and the socket housing.

In some example embodiments, the conductive pad may contact the probe needles.

In some example embodiments, the semiconductor chip package test socket may further comprise a probe card fixing the probe needles and/or power lead-in wires connected to the probe card.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
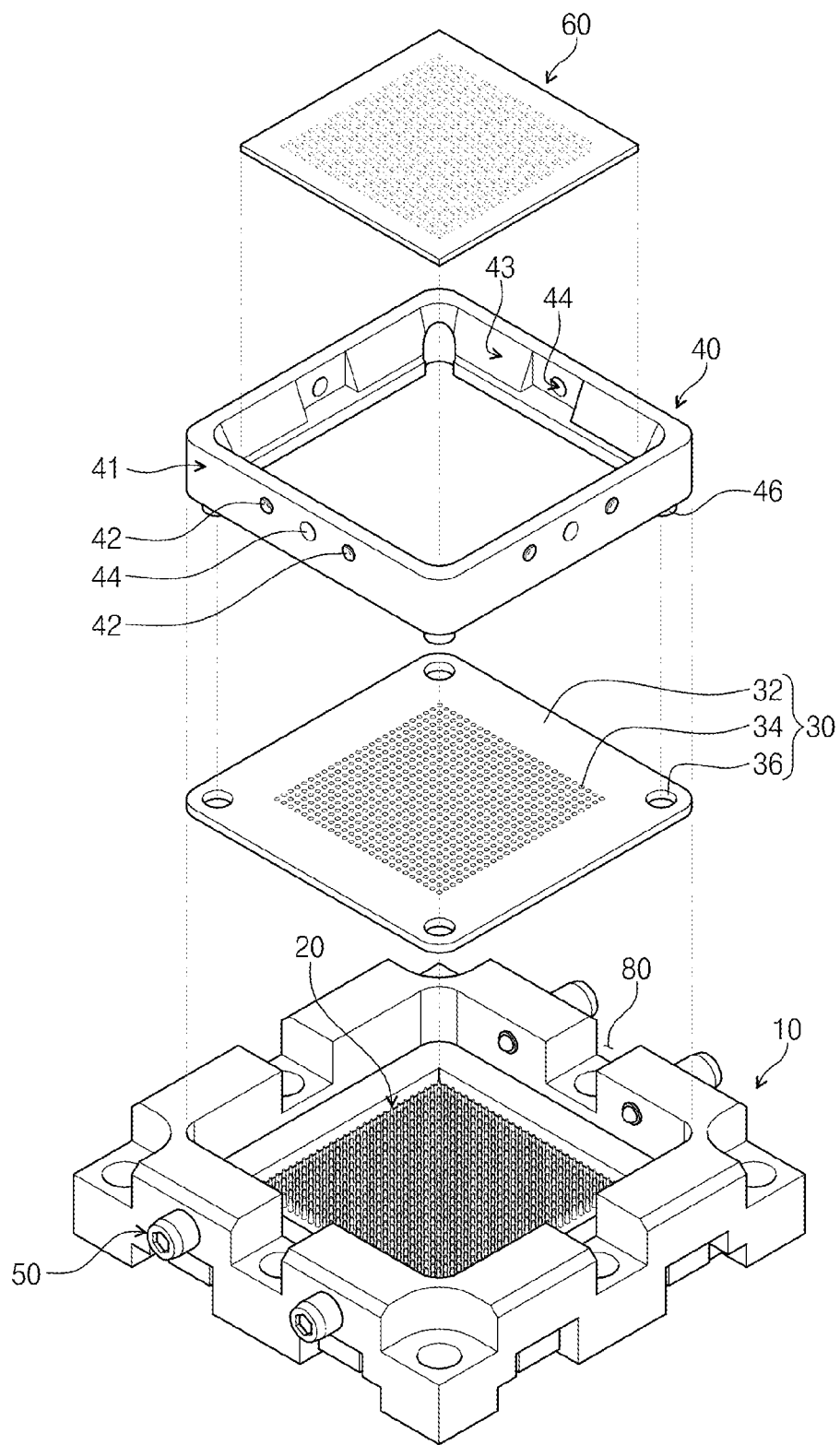
FIG. 1 is an exploded perspective view illustrating a semiconductor chip package test socket according to some example embodiments of the inventive concept.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 2:
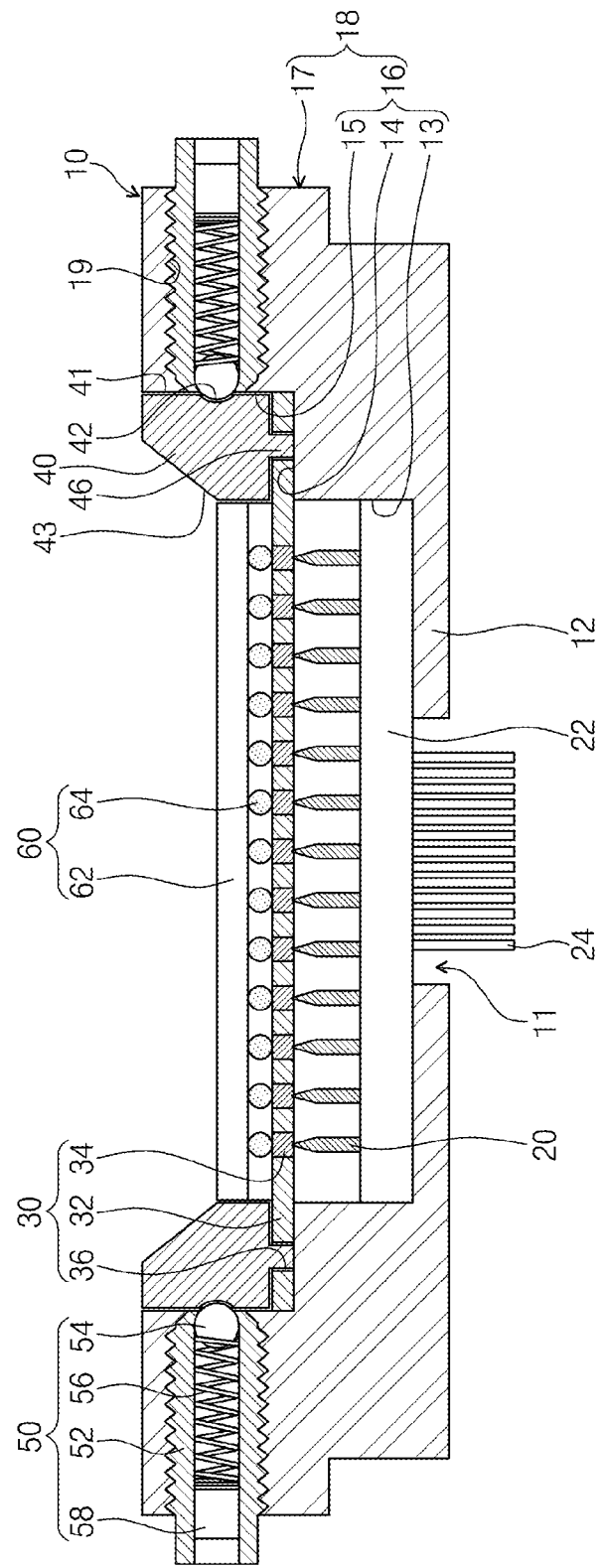
FIG. 2 is a combined cross-sectional view illustrating a semiconductor chip package test socket of FIG. 1.

FIG. 1 is an exploded perspective view illustrating a semiconductor chip package test socket according to some example embodiments of the inventive concept. FIG. 2 is a combined cross-sectional view of FIG. 1.

Referring to FIGS. 1 and 2, a semiconductor chip package test socket according to embodiments may include ball plungers 50 which facilitate combination and separation of a socket housing 10 (hereinafter, referred to as 'a housing') and a floating guide 40. A conductive pad 30 may be fixed in the housing 10 by the floating guide 40. The conductive pad 30 may be replaced by new ones every 3 days in semiconductor production line. The floating guide 40 may easily be separated from the housing 10 by an external force during replacement of the conductive pad 30. Ball plungers 50 may facilitate attachment between the housing 10 and the floating guide 40.

Thus, the semiconductor chip package test socket according to some example embodiments of the inventive concept may increase and/or maximize productivity.

A semiconductor chip package 60 may include a chip die 62 and solder balls 64 disposed on a bottom of the chip die 62. For example, the chip die 62 may have a width of about 13 mm and a length of about 13 mm. The semiconductor chip package 60 may be mounted on a printed circuit board (not shown) of a product by a flip chip bonding method.

The housing 10 may receive probe needles 20 and a probe card 22 which perform an electrical performance test of the semiconductor chip package 60. Power lead-in wires 24 may be connected to an external system through a wire-hole 11 disposed under the probe card 22. The probe needles 20 may be mounted on the probe card 22. The housing 10 may receive the conductive pad 30 disposed on the probe needles 20, and the floating guide 40 fixing the conductive pad 30.

The housing 10 may include a bottom part 12 and a sidewall part 18. The bottom part 12 may support the probe card 22 and the probe needles 20, and the sidewall part 18 may surround the probe card 22, the conductive pad 30, and the floating guide 40. The probe card 22, the conductive pad 30, and the floating guide 40 may be in contact with an inner sidewall 16 of the housing 10. The inner sidewall 16 of the housing 10 may include a lower inner sidewall 13 surrounding the probe card 22 and probe needles 20, an upper inner sidewall 15 surrounding the conductive pad 30 and the floating guide 40, and a step 14 connecting the lower inner sidewall 13 and the upper inner sidewall 15 to each other. The step 14 may support the conductive pad 30 and the floating guide 40. The housing 10 may have screw-holes 19 extending from an outer sidewall 17 of the housing 10 to the upper inner sidewall 15. The step 14 may be disposed at a level lower than the screw-holes 19. A pair of screw-holes 19 may be disposed at the upper inner sidewall 15 to face each other. The ball plungers 50 may be inserted in the screw-holes 19, respectively. Sidewall trenches 80 may be disposed between the screw-holes 19. Even though not shown in the drawings, the sidewall trenches 80 may expose portions of an outer sidewall 41 of the floating guide 40 externally. Additionally, the sidewall trenches 80 may be connected to pin-holes 44.

Each of the ball plungers 50 may include a casing 52 inserted in the screw-hole 19, a ball 54 moved in the casing 52, a spring 56 providing an elastic force to the ball 54, and a support part 58 supporting the spring 56 at a side opposite to the ball 54. The casing 52 may have a screw thread. The ball 54 may have a diameter within a range of about 0.5 mm to about 1 mm. The ball 54 may protrude from a side of the casing 52 by the spring 56. The balls 54 may be in contact with the floating guide 40 by the elastic force of the springs 56. The ball plungers 50 may correspond to a clamp fixing the floating guide 40 in the housing 10.

The conductive pad 30 may be fixed between the floating guide 40 and the step 14 of the housing 10. The conductive pad 30 may include a pad rubber 32 and conductive patterns 34. The pad rubber 32 may have alignment-holes 36 disposed an edge thereof. The pad rubber 32 may include a synthetic rubber of a silicon material. The conductive patterns 34 may penetrate the pad rubber 32 to connect the solder balls 64 to the probe needles 20. The conductive patterns 34 may increase a lifetime of the probe needles 20. The conductive patterns 34 may include gold powder. Since the conductive patterns 34 may be damaged by contact with the solder balls 64, the conductive patterns 34 may determine a lifetime of the conductive pad 30. For example, the conductive pad 30 have a lifetime of about 30,000 times to about 150,000 times (e.g., about three days) during electrical performance tests of semiconductor chip packages 60.

The floating guide 40 may cover an edge of the conductive pad 30 on the step 14 of the housing 10. The floating guide 40 may have a quadrangular ring-shape. The floating guide 40 may have protrusions respectively inserted in the alignment-holes 36 of the pad rubber 32. The protrusions 46 may evenly fix the conductive pad 30. The semiconductor chip package 60 may slide on an inclined plane 43 which may be portions of an inner sidewall of the floating guide 40. The floating guide 40 may include concave regions 42 and the pin-holes 44. The concave region 42 may be formed at the outer sidewall 41 of the floating guide 40. The pin-holes 44 may penetrate the floating guide 40 from the outer sidewall 41 to the inner sidewall of the floating guide 40. The concave regions 42 may be in contact with the balls 54 of the ball plungers 50, respectively. The pin-holes 44 may be disposed between the concave regions 42. Additionally, the pin-holes 44 may be symmetrically disposed in walls of the floating guide 40, respectively. The pin-holes 44 may be aligned with the sidewall trenches 80 formed in the sidewall part 18 of the housing 10, respectively. The sidewall trenches 80 may guide pins or hooks 70 of FIG. 3 passing through the pin-holes 44.

Figure 3:
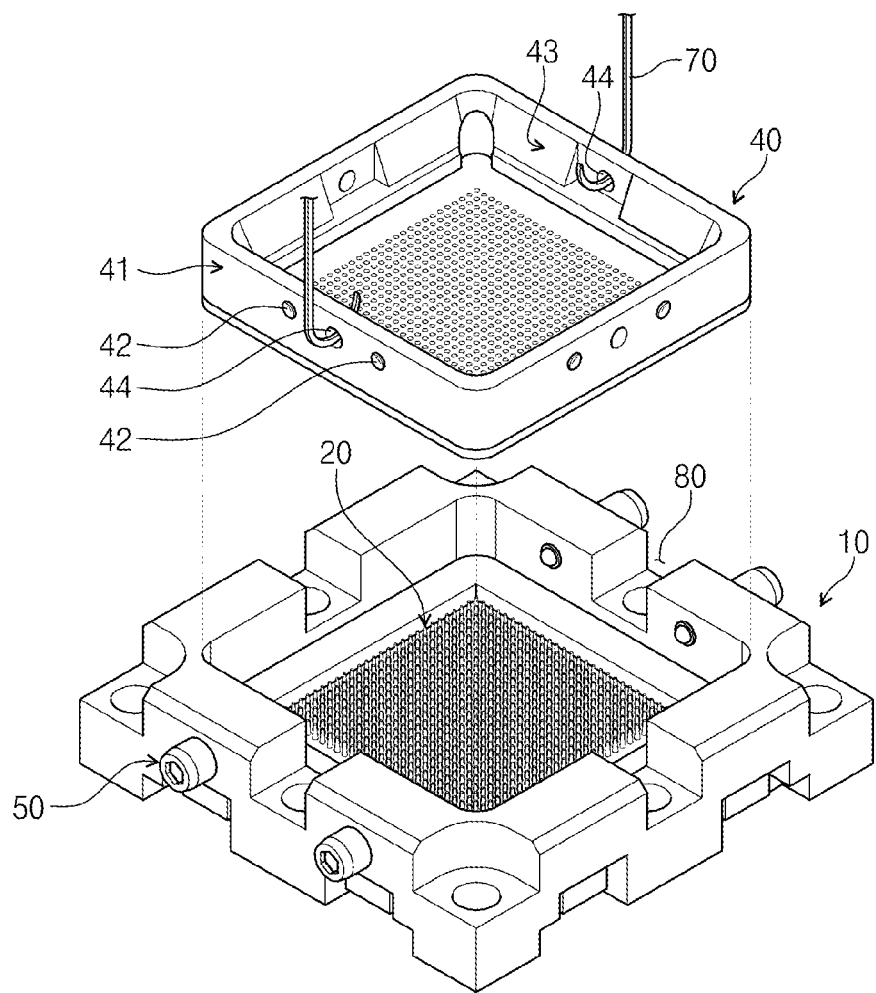
FIG. 3 is a perspective view illustrating a method of separating a floating guide from a housing.

FIG. 3 is a perspective view illustrating a method of separating a floating guide from a housing.

Referring to FIG. 3, hooks 70 may be inserted into the inside of the housing 10 through the sidewall trenches 80. For example, when the conductive pad 30 is replaced with new one, a worker may insert the hooks 70 into the pin-holes 44 and then separate the floating guide 40 from the housing 10 by using force (i.e., an external force). The ball plungers 50 may be unlocked simultaneously with the separation of the floating guide 40 by the hooks 70. The hooks may provide the external force to the floating guide 40. If the external force is greater than the elastic force of the spring 56, the balls 54 may be separated from the concave regions 42. Thus, the floating guide 40 may be separated from the housing 10. After the conductive pad 30 is replaced with new one, the floating guide 40 may be inserted in the housing 10 by a finger pressure of the worker, and then be fixed by the ball plungers 50. The ball plungers 50 may be combined with the housing 10 by the elastic force of the springs 56. Thus, the floating guide 40 may be easily separated from the housing 10 when it is replaced with new one.

As a result, the semiconductor chip package test socket according to some example embodiments of the inventive concept may increase or maximize productivity.

According to some example embodiments of the inventive concept, the ball plungers may combine the floating guide within the socket housing. The floating guide may fix the conductive pad in the socket housing. The ball plungers may be unlocked when the floating guide is separated from the socket housing. The floating guide may be easily separated from the socket housing when the conductive pad is replaced with new one. The ball plungers may be capable of easily removing the floating guide from the socket housing.

As a result, the semiconductor chip package test socket according to embodiments of the inventive concept may increase or maximize productivity.

While example embodiments of the inventive concept have been particularly shown and described, it will be understood by those of ordinary skill in the art that various changes in form and details may be made therein without departing from the spirit and scope of the present invention as defined by the following claims.

What is claimed is:

1. A semiconductor chip package test socket, comprising:
   a socket housing;
   a plurality of probe needles in the socket housing;
   a conductive pad on the probe needles;
   a floating guide configured to cover an edge of the conductive pad and configured to provide a semiconductor chip package on the conductive pad; and
   clamps fixed at the socket housing;
   wherein the clamps combine the floating guide with the socket housing.

2. The semiconductor chip package test socket of claim 1, wherein the clamps include ball plungers.

3. The semiconductor chip package test socket of claim 2, wherein the socket housing has screw-holes configured to fix the ball plungers.

4. The semiconductor chip package test socket of claim 3, wherein the socket housing includes a bottom part configured to support the probe needles and a sidewall part configured to surround the conductive pad and the floating guide, and
   wherein the screw-holes penetrate the sidewall part and face each other.

5. The semiconductor chip package test socket of claim 4, wherein an inner sidewall of the sidewall part of the socket housing includes a step configured to support the edge of the conductive pad and the floating guide, and
wherein the screw-holes are at a level lower than the step.

6. The semiconductor chip package test socket of claim 2, wherein the floating guide has a quadrangular ring-shape.

7. The semiconductor chip package test socket of claim 2, wherein the floating guide includes concave regions in which the ball plungers are inserted.

8. The semiconductor chip package test socket of claim 1, wherein the floating guide includes pin-holes.

9. The semiconductor chip package test socket of claim 8, wherein the socket housing includes sidewall trenches aligned with the pin-holes.

10. The semiconductor chip package test socket of claim 1, wherein the floating guide includes protrusions configured to fix the conductive pad.

11. The semiconductor chip package test socket of claim 10, wherein the conductive pad includes alignments holes configured to receive the protrusions.

12. The semiconductor chip package test socket of claim 1, wherein an inner sidewall of the floating guide includes an inclined plane.

13. The semiconductor chip package test socket of claim 2, wherein each of the ball plungers comprises:
a casing;
a ball configured to move in the casing;
a spring configured to provide an elastic force to the ball; and
a support part configured to support the spring at a side opposite to the ball.

14. The semiconductor chip package test socket of claim 1, further comprising:
a probe card fixing the probe needles; and
power lead-in wires connected to the probe card.

15. The semiconductor chip package test socket of claim 14, wherein the socket housing has a wire-hole under the probe card, and
wherein the power lead-in wires pass through the wire-hole.

16. A semiconductor chip package test socket, comprising:
a socket housing;
a plurality of probe needles associated with the socket housing;
a conductive pad configured to contact the probe needles;
a floating guide configured to cover an edge of the conductive pad and configured to align a semiconductor chip package with the conductive pad; and
a plurality of devices associated with the socket housing that are configured to connect the floating guide to the socket housing.

17. The semiconductor chip package test socket of claim 16, further comprising:
a probe card fixing the probe needles; and
power lead-in wires connected to the probe card.

18. A semiconductor chip package test socket, comprising:
a socket housing;
a plurality of probe needles associated with the socket housing;
a conductive pad on the probe needles;
a floating guide configured to cover an edge of the conductive pad and configured to align a semiconductor chip package on the conductive pad; and
a plurality of devices associated with the socket housing that are configured to couple the floating guide and the socket housing.

19. The semiconductor chip package test socket of claim 18, wherein the conductive pad contacts the probe needles.

20. The semiconductor chip package test socket of claim 18, further comprising:
a probe card fixing the probe needles; and
power lead-in wires connected to the probe card.

* * * * *